(12) United States Patent
Tschumakow et al.

(10) Patent No.: US 11,195,766 B2
(45) Date of Patent: Dec. 7, 2021

(54) MANUFACTURING A COMBINED SEMICONDUCTOR DEVICE

(71) Applicant: Infineon Technologies AG, Neubiberg (DE)

(72) Inventors: Dmitri Alex Tschumakow, Dresden (DE); Claus Dahl, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 57 days.

(21) Appl. No.: 16/129,201

(22) Filed: Sep. 12, 2018

(65) Prior Publication Data
US 2019/0080966 A1 Mar. 14, 2019

(30) Foreign Application Priority Data
Sep. 13, 2017 (DE) .......................... 102017216214.7

(51) Int. Cl.
| | |
|---|---|
| *H01L 21/8249* | (2006.01) |
| *H01L 21/033* | (2006.01) |
| *H01L 21/3213* | (2006.01) |
| *H01L 21/8238* | (2006.01) |
| *H01L 27/06* | (2006.01) |

(52) U.S. Cl.
CPC ...... *H01L 21/8249* (2013.01); *H01L 21/0337* (2013.01); *H01L 21/32139* (2013.01); *H01L 21/823864* (2013.01); *H01L 27/0623* (2013.01)

(58) Field of Classification Search
None
See application file for complete search history.

(56) References Cited

U.S. PATENT DOCUMENTS

| | | | | |
|---|---|---|---|---|
| 6,784,063 B2* | 8/2004 | Cha | ..................... | H01L 21/8249 257/205 |
| 6,830,967 B1* | 12/2004 | Yin | ..................... | H01L 21/8249 257/E21.696 |
| 6,881,976 B1* | 4/2005 | Zheng | ................. | H01L 21/8249 257/192 |
| 7,348,632 B2* | 3/2008 | Kang | ...................... | H01L 21/84 257/347 |
| 7,709,339 B2* | 5/2010 | Dahl | ................. | H01L 29/66242 438/366 |
| 8,129,234 B2* | 3/2012 | Wallner | .............. | H01L 27/0623 438/204 |
| 8,993,393 B2* | 3/2015 | Yeh | ................... | H01L 21/28518 438/202 |

(Continued)

FOREIGN PATENT DOCUMENTS

DE  102004021241 A1  11/2005

*Primary Examiner* — David E Graybill
(74) *Attorney, Agent, or Firm* — Schiff Hardin LLP

(57) ABSTRACT

A method for manufacturing a combined semiconductor device. The method includes providing a semiconductor substrate, providing a protective layer or a protective layer stack in a non-CMOS area of the semiconductor substrate, wherein the non-CMOS area is portion of the semiconductor substrate reserved for a non-CMOS device, at least partially manufacturing a CMOS device in a CMOS area of the semiconductor substrate, the non-CMOS area and the CMOS area being different from each other, removing the protective layer or the protective layer stack, to expose the semiconductor substrate in the non-CMOS area, and manufacturing a non-CMOS device in the non-CMOS area of the semiconductor substrate.

15 Claims, 6 Drawing Sheets

(56) References Cited

U.S. PATENT DOCUMENTS

| | | | |
|---|---|---|---|
| 9,269,706 B2* | 2/2016 | Gridelet | H01L 27/11546 |
| 9,385,117 B2* | 7/2016 | Mehrotra | H01L 29/66628 |
| 9,496,184 B2* | 11/2016 | Chang | H01L 29/6625 |
| 9,640,528 B2* | 5/2017 | Preisler | H01L 27/0623 |
| 9,673,191 B2* | 6/2017 | Preisler | H01L 21/8249 |
| 9,812,370 B2* | 11/2017 | Chang | H01L 29/66545 |
| 10,290,630 B2* | 5/2019 | Preisler | H01L 21/8249 |
| 10,297,591 B2* | 5/2019 | Preisler | H01L 27/0623 |
| 2004/0072399 A1* | 4/2004 | Cha | H01L 21/8249 |
| | | | 438/202 |
| 2005/0098834 A1* | 5/2005 | Zheng | H01L 21/8249 |
| | | | 257/371 |
| 2005/0139921 A1* | 6/2005 | Kang | H01L 27/1203 |
| | | | 257/347 |
| 2007/0161176 A1* | 7/2007 | Dahl | H01L 21/8249 |
| | | | 438/230 |
| 2011/0057266 A1* | 3/2011 | Wallner | H01L 27/0623 |
| | | | 257/378 |
| 2011/0193174 A1* | 8/2011 | Yeh | H01L 21/28518 |
| | | | 257/370 |
| 2014/0167055 A1* | 6/2014 | Gridelet | H01L 27/11546 |
| | | | 257/66 |
| 2015/0187755 A1* | 7/2015 | Mehrotra | H01L 29/737 |
| | | | 257/192 |
| 2015/0287642 A1* | 10/2015 | Chang | H01L 27/0623 |
| | | | 438/236 |
| 2015/0303185 A1* | 10/2015 | Preisler | H01L 27/0623 |
| | | | 257/370 |
| 2015/0303186 A1* | 10/2015 | Preisler | H01L 27/102 |
| | | | 257/370 |
| 2015/0303187 A1* | 10/2015 | Preisler | H01L 27/0623 |
| | | | 257/370 |
| 2015/0303188 A1* | 10/2015 | Preisler | H01L 21/8249 |
| | | | 257/51 |
| 2016/0284691 A1* | 9/2016 | Mehrotra | H01L 29/7833 |
| 2017/0040219 A1* | 2/2017 | Chang | H01L 29/735 |
| 2019/0080966 A1* | 3/2019 | Tschumakow | H01L 21/0337 |

* cited by examiner

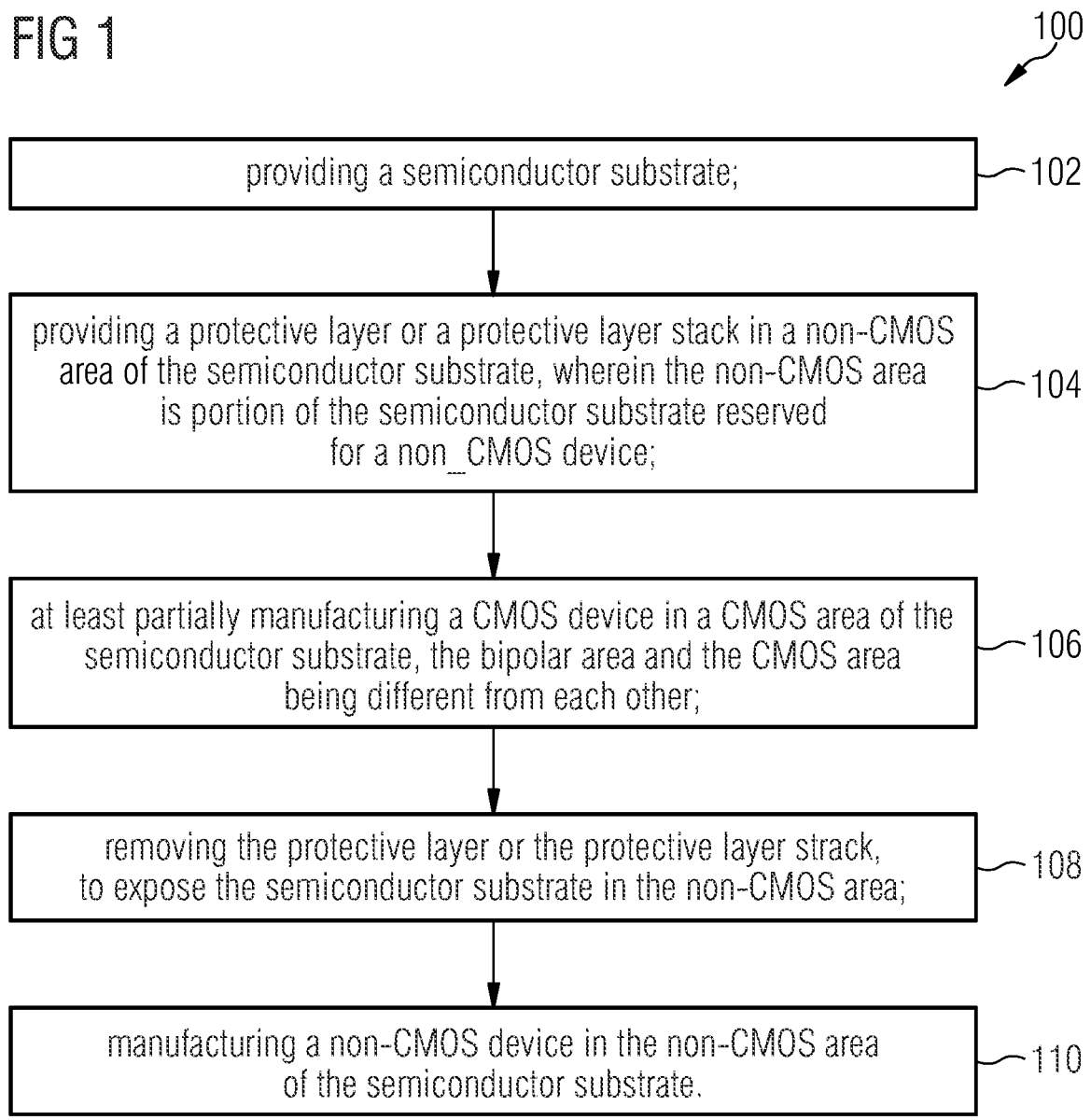

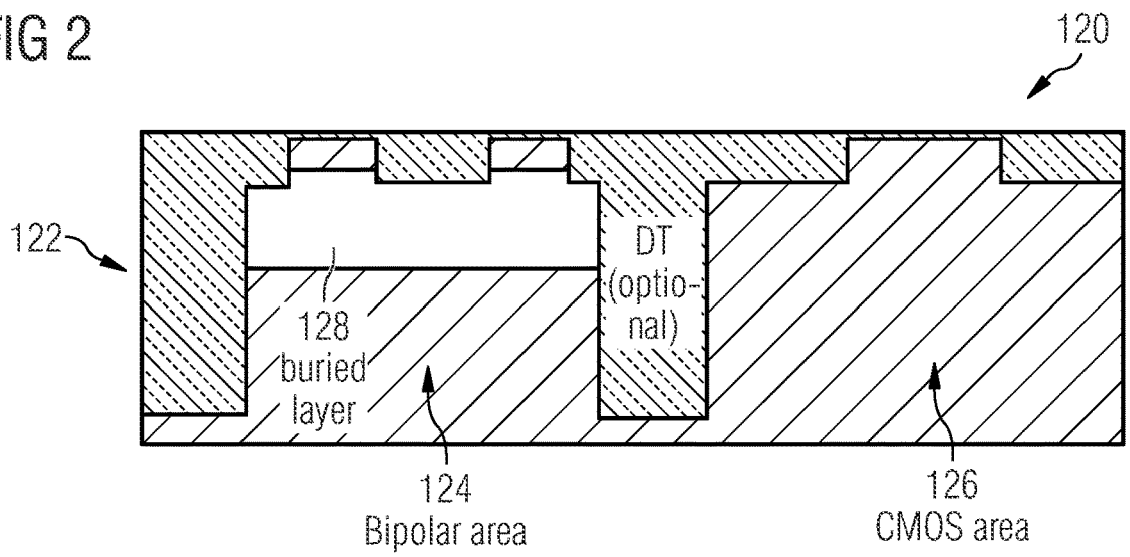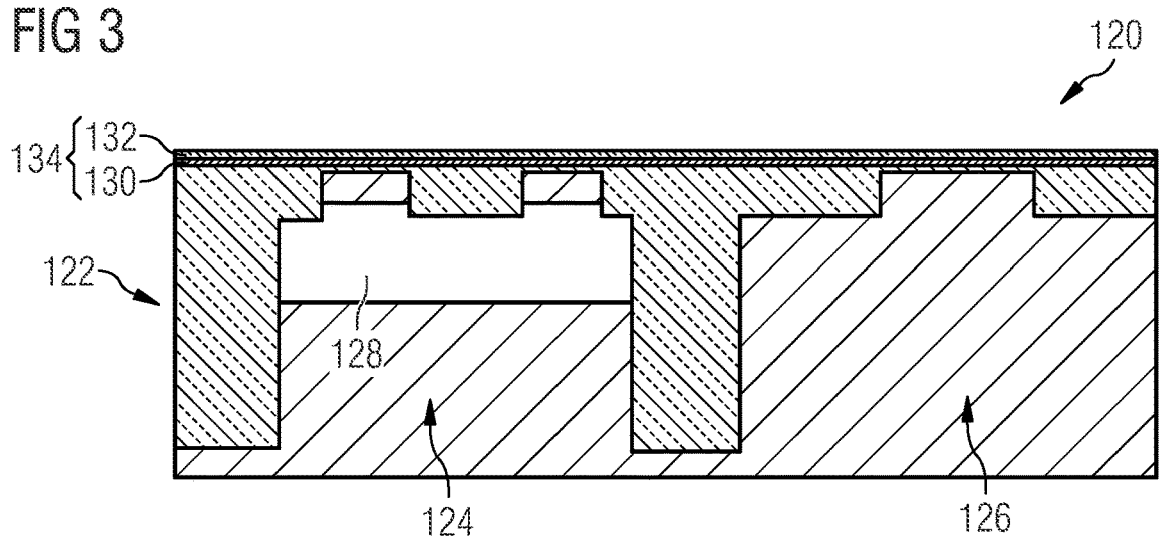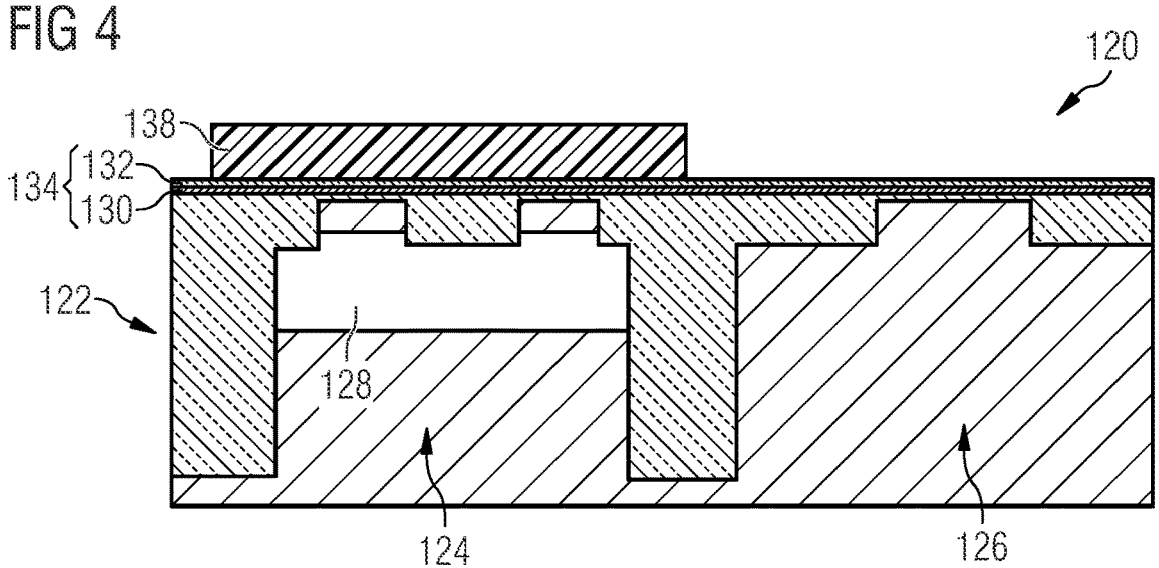

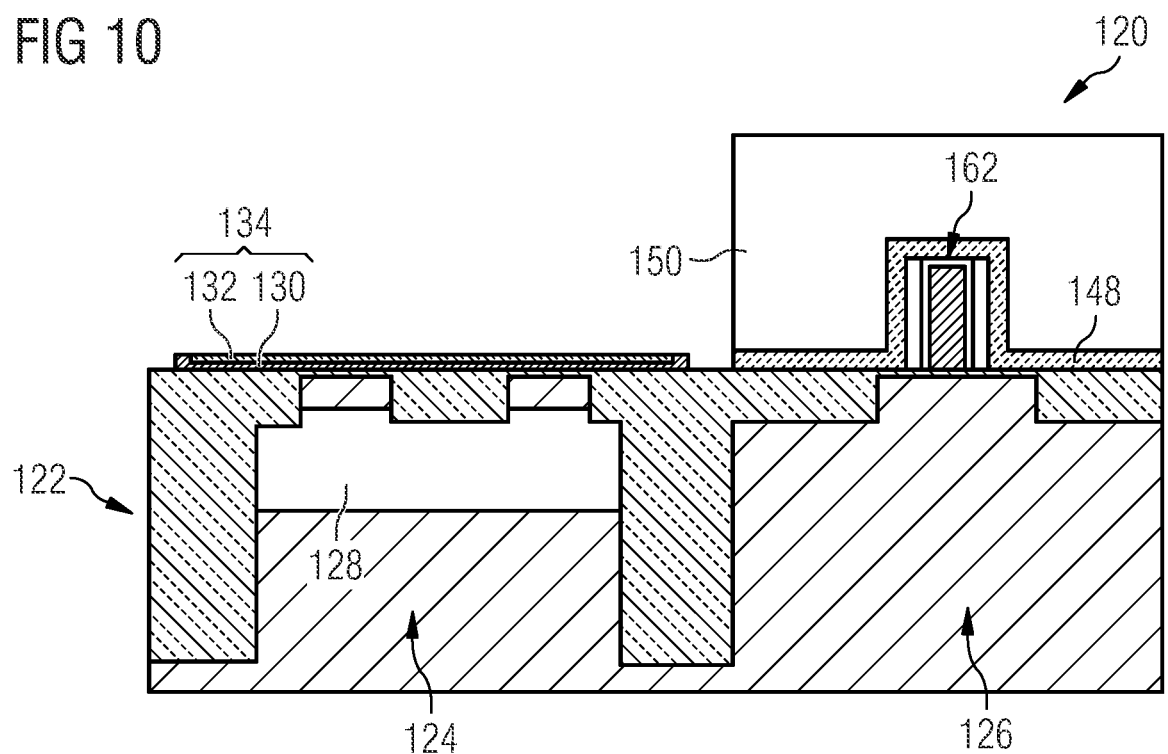
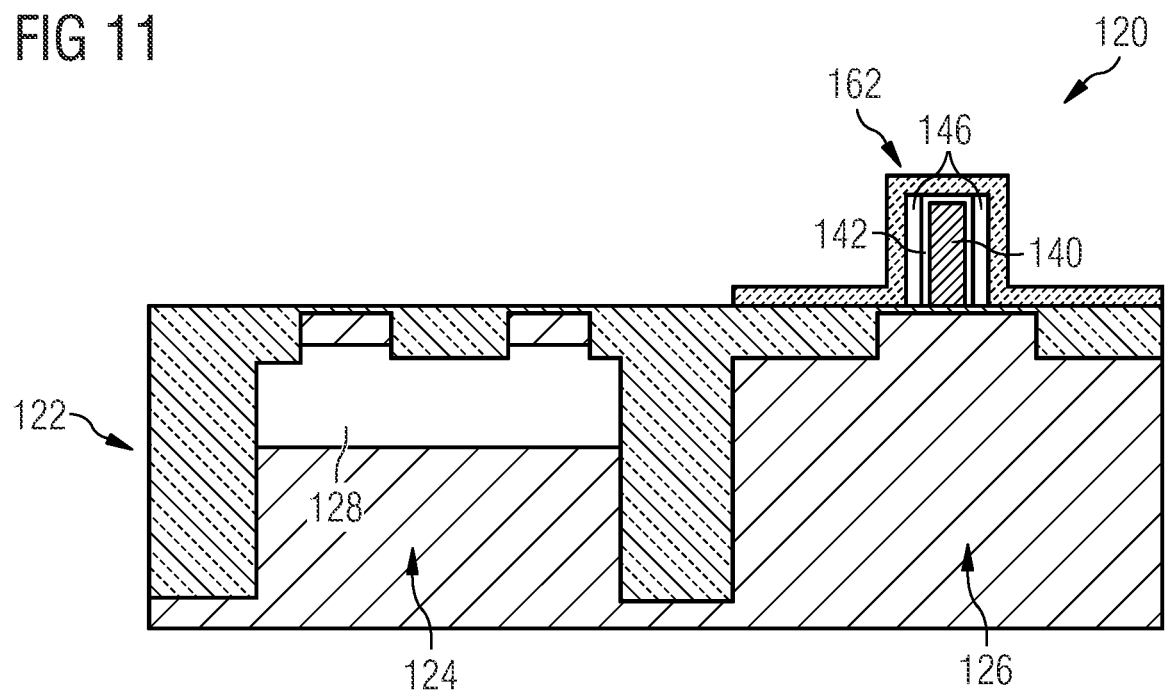

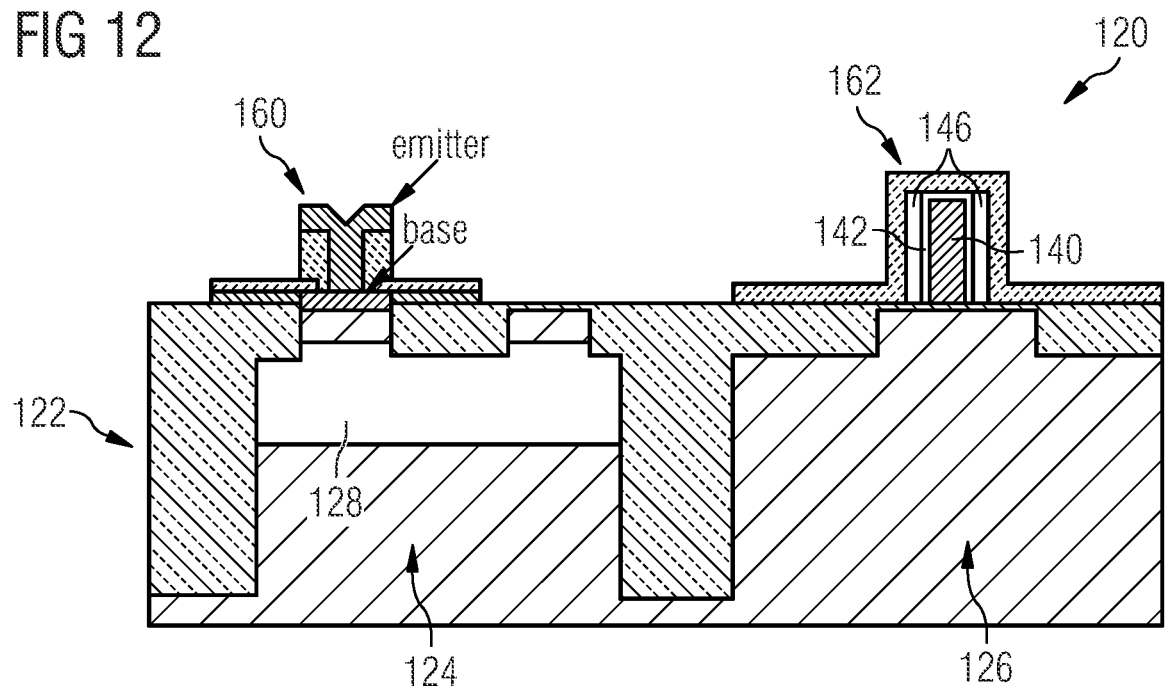
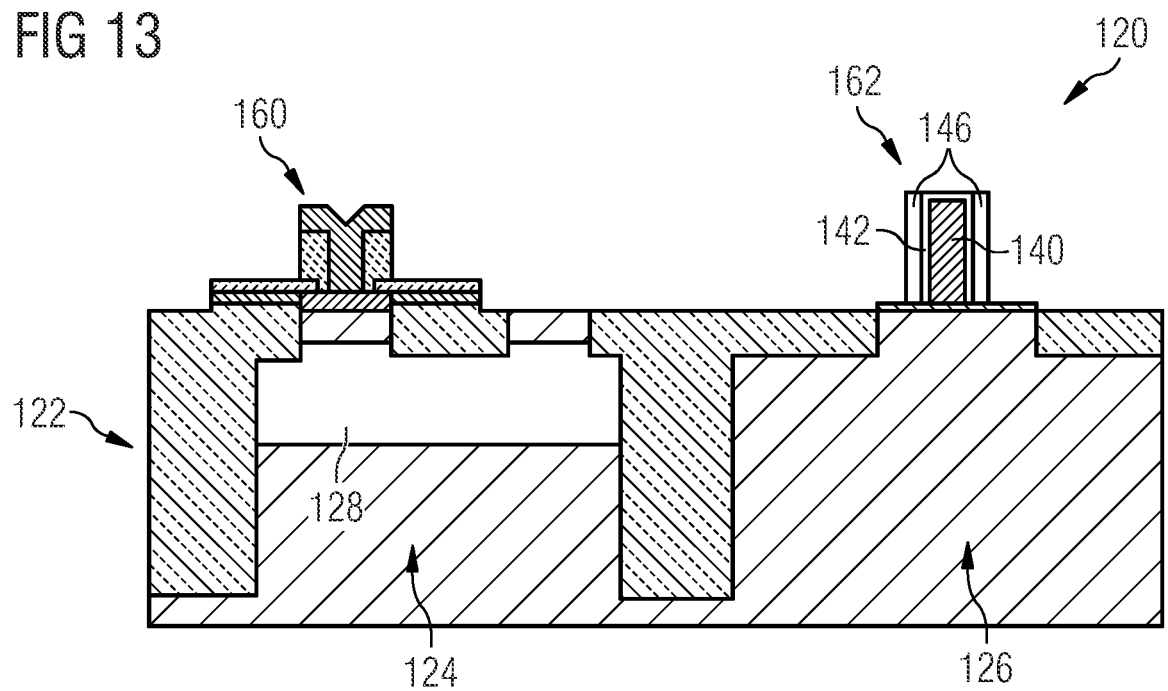

MANUFACTURING A COMBINED SEMICONDUCTOR DEVICE

TECHNICAL FIELD

Embodiments relate to a method for manufacturing a combined semiconductor device having a CMOS portion and a non-CMOS portion. Some embodiments relate to a method for protection of a bipolar transistor area in a BiCMOS flow prior to CMOS processing.

BACKGROUND

A BiCMOS device integrates a bipolar device and a CMOS device (CMOS=complementary metal-oxide-semiconductor). The state of the art BiCMOS integration utilizes a mixed processing of the bipolar and CMOS devices. The corresponding bipolar- and CMOS steps are applied in turns, so that certain steps are common and cannot be separated from each other.

BRIEF DESCRIPTION OF THE DRAWINGS

FIG. 1 shows a flowchart of a manufacturing method for manufacturing a BiCMOS device;

FIG. 2 shows a schematic cross-sectional view of the BiCMOS device during manufacturing after the step of providing the semiconductor substrate;

FIG. 3 shows a schematic cross-sectional view of the BiCMOS device during manufacturing during the step of providing the protective layer stack in the bipolar area of the semiconductor substrate by depositing the protective layer stack on the semiconductor substrate;

FIG. 4 shows schematic cross-sectional view of the BiCMOS device during manufacturing during the step of providing the protective layer stack in the bipolar area of the semiconductor substrate by structuring the protective layer stack;

FIG. 10 shows a schematic cross-sectional view of the BiCMOS device during manufacturing after a step of providing a protective mask on the at least partially manufactured CMOS transistor before removing the protective layer stack;

FIG. 11 shows a schematic cross-sectional view of the BiCMOS device during manufacturing after the step of removing the protective layer stack, to expose the semiconductor substrate in the bipolar area;

FIG. 12 shows a schematic cross-sectional view of the BiCMOS device during manufacturing after the step of at least partially manufacturing the bipolar transistor in the bipolar area of the semiconductor substrate; and FIG. 13 shows a schematic cross-sectional view of the BiCMOS device during manufacturing during a step of commonly completing the manufacturing of the bipolar transistor and of the CMOS transistor.

DETAILED DESCRIPTION

Figure 5:
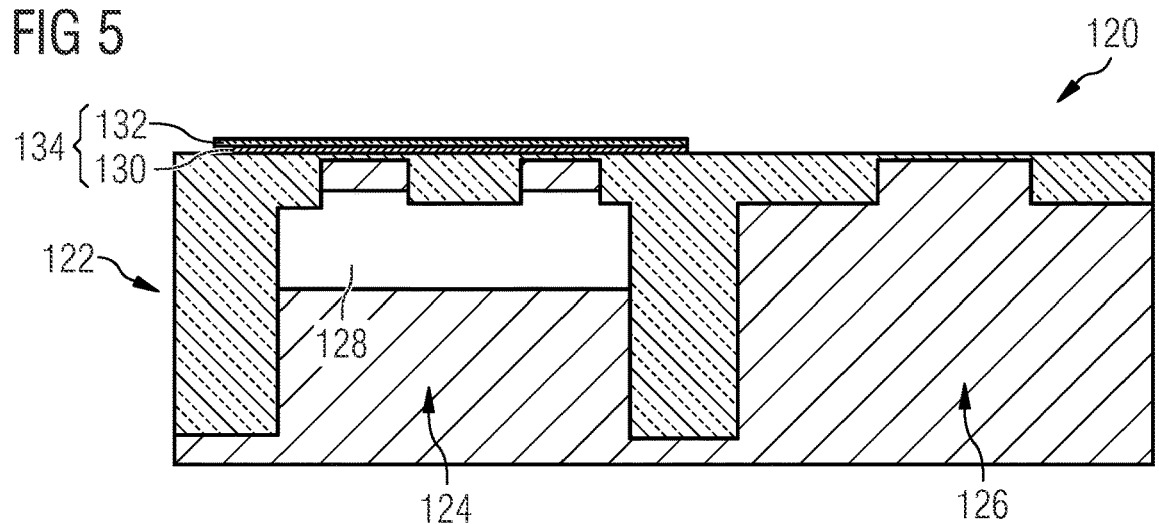
FIG. 5 shows a schematic cross-sectional view of the BiCMOS device during manufacturing after the step of providing the protective layer stack in the bipolar area of the semiconductor substrate.

Below, embodiments of the present disclosure will subsequently be discussed referring to the enclosed figures, wherein identical reference numerals are provided to objects or elements having the same or similar function so that the description thereof is mutually applicable and interchangeable.

FIG. 1 shows a flowchart of a method 100 for manufacturing a combined semiconductor device. The method 100 comprises a step 102 of providing a semiconductor substrate. Further, the method 100 comprises a step 104 of providing a protective layer or a protective layer stack in a non-CMOS area (or non-CMOS region) of the semiconductor substrate, wherein the non-CMOS area is a portion of the semiconductor substrate reserved for a non-CMOS device. Further, the method 100 comprises a step 106 of at least partially manufacturing a CMOS device in a CMOS area (or CMOS region) of the semiconductor substrate, the non-CMOS area and the CMOS area being different from each other. Further, the method 100 comprises a step 108 of removing the protective layer or the protective layer stack, to expose the semiconductor substrate in the non-CMOS area. Further, the method 100 comprises a step 110 of manufacturing a non-CMOS device in the non-CMOS area of the semiconductor substrate.

In embodiments, the area (of the semiconductor substrate) that will be occupied by a non-CMOS device (for example, a bipolar device (e.g., a bipolar transistor), a MEMS device or a sensor) can be pre-defined, to safely encapsulate it by a protective layer or protective layer stack (e.g., a dedicated system of films) before the CMOS-relevant steps are applied. Thereby, the active area of the non-CMOS device can be isolated from undesired damages and modifications. Such damages can be done especially during etch back steps, e.g., by spacer etching. The pre-encapsulated non-CMOS area may withstand any CMOS relevant etches and other potentially undesired processes. After the CMOS part is completed, the non-CMOS device area can be opened and the non-CMOS device processing can start. This can be relevant, for example, for bipolar last approaches, where the bipolar device is processed after a CMOS device is almost or completely done. This approach can be useful, for example, for dedicated and/or defined removal of layers and for separation or dedicated engineering of thermal budgets of bipolar and CMOS devices.

Subsequently, embodiments of the method for manufacturing 100 shown in FIG. 1 are described in further detail making reference to FIGS. 2 to 13 which show cross-sectional views of the combined semiconductor device after different manufacturing steps. Thereby, it is exemplarily assumed that the non-CMOS device to be manufactured is a bipolar device, and in particular, a bipolar transistor and that the CMOS device to be manufactured is a CMOS transistor. However, the following description is also applicable to other non-CMOS devices, such as diodes, varactors, sensors, MEMS elements that may require a separate processing from each other or from CMOS.

FIG. 2 shows a schematic cross-sectional view of the BiCMOS device 120 during manufacturing after the step 122 of providing the semiconductor substrate 122. The semiconductor substrate 122 can be, for example, a silicon substrate. The semiconductor substrate 122 can comprise a bipolar area (or bipolar region) 124, e.g., a portion of the semiconductor substrate 122 reserved for the bipolar transistor or that will be occupied by the bipolar transistor, and a CMOS area (or CMOS region) 126, e.g., a portion of the semiconductor substrate 122 reserved for the CMOS transistor or that will be occupied by the CMOS transistor. Further, as shown in FIG. 2, the bipolar area 124 can be pre-structured (or pre-processed). For example, the semiconductor substrate 122 can comprise in the bipolar area 124 a buried layer 128. Further, the semiconductor substrate 122 can comprise a shallow trench insulation and/or a deep trench insulation.

In other words, FIG. 2 shows a substrate that was preliminary processed. Here the shallow trench insulation (STI) module is completed. Additionally, the optional deep trench insulation (DT) module is completed. Optional buried layers that typically serve as collector sinkers are also completed. Any other modules or devices that are common for both types of transistors, or are transistor specific but can be processed without interfering with another transistor type, are processed up to now.

Subsequently, the step 104 of providing the protective layer or protective layer stack in the bipolar area 124 of the semiconductor substrate 122 is described making reference to FIG. 3 to FIG. 5. As becomes evident, the protective layer or protective layer stack is provided before the at least partially manufacturing of the CMOS transistor, in order to protect the bipolar area 124 of the semiconductor substrate 122 during the at least partially manufacturing of the CMOS transistor.

In the following description, it is assumed that a protective layer stack comprising two layers is provided. Naturally, the following description is also applicable for a single protective layer or a protective layer stack comprising more than two layers.

FIG. 3 shows a schematic cross-sectional view of the BiCMOS device 120 during manufacturing during the step 104 of providing the protective layer stack 134 in the bipolar area 124 of the semiconductor substrate 122 by depositing the protective layer stack 134 on the semiconductor substrate 122. As shown in FIG. 3 by way of example, the protective layer stack 134 can comprise two protective layers 130 and 132, e.g., of materials having different etch selectivity (e.g., materials etchable with different etch rates (selectivity)). For example, a first protective layer 130 of a material etchable with a first etch rate, and a second protective layer 132 of a material etchable with a second etch rate, different from the first etch rate. For example, the first protective layer 130 can comprise oxide. For example, the second protective layer 132 can comprise nitride.

In other words, in FIG. 3 the preparation for separate processing of bipolar and CMOS transistors starts. The layer system 134 consisting of one or more layers 130, 132 can be deposited, e.g., on the whole wafer 122. In this example, the combination of nitride and oxide layers can be used. This is the protecting stack 134.

FIG. 4 shows schematic cross-sectional view of the BiCMOS device 120 during manufacturing during the step 104 of providing the protective layer stack 134 in the bipolar area 124 of the semiconductor substrate 122 by structuring the protective layer stack 134. As shown in FIG. 4, the protective layer stack 134 can be structured by providing a protecting mask (e.g., a lithographic mask) on the protective layer stack 134, thereby defining the bipolar area 124 of the semiconductor substrate.

In other words, a lithography mask 138 that defines the bipolar transistor area can be applied.

FIG. 5 shows a schematic cross-sectional view of the BiCMOS device 120 during manufacturing after the step 104 of providing the protective layer stack 134 in the bipolar area 124 of the semiconductor substrate 122. The protective layer stack 134 in the bipolar area 124 can be obtained by selectively removing the protective layer stack 134 outside the bipolar area (e.g., covered by the protective mask 138), while maintaining the protective layer stack 134 in the bipolar area 124.

For example, the unmasked part of the protecting stack 134 can be etched by any suitable etching, wet or dry. In the shown example, it would be typical to perform oxide dry etching followed by mask stripping and wet etching of the nitride.

After the protective layer stack 134 is provided on the semiconductor substrate 122 in the bipolar area 124, to protect the bipolar area 124 of the semiconductor substrate 122 during the at least partial manufacturing of the CMOS transistor, the CMOS transistor can be at least partially manufactured.

Subsequently, the at least partial manufacturing of the CMOS transistor is described by way of example making reference to FIGS. 6 to 9. Although FIGS. 6 to 9 show the partial manufacturing of the CMOS transistor, also any other CMOS device can be at least partially manufactured in a similar manner.

Figure 6:
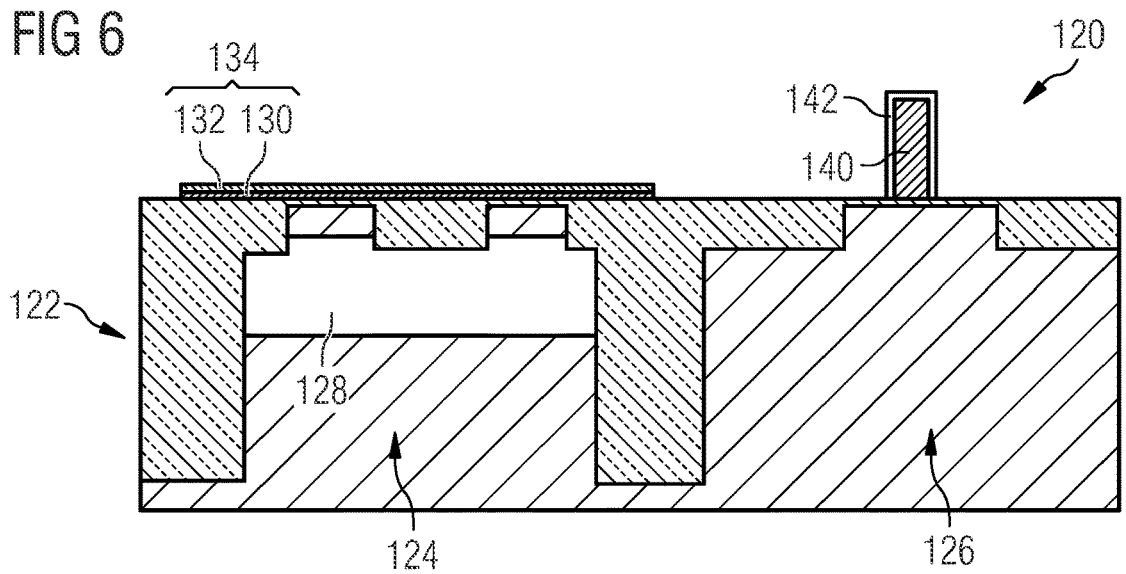
FIG. 6 shows a schematic cross-sectional view of the BiCMOS device during manufacturing during the step of the at least partial manufacturing of the CMOS transistor by providing a CMOS gate in the CMOS area.

FIG. 6 shows a schematic cross-sectional view of the BiCMOS device 120 during manufacturing during the step 106 of the at least partial manufacturing of the CMOS transistor by providing a CMOS gate 140 in the CMOS area 126. Further, a gate oxide 142 can be provided on the CMOS gate 140.

In other words, in FIG. 6, the CMOS gate 140 can be processed, typically followed by either side wall oxidation or spacer deposition. The shown gate module is used only as an example. Any other kind of gate embodiment can be used (e. g. high k metal gate).

Note that, in embodiments, the CMOS gate 140 can also be provided before providing the protective layer stack 134 on the semiconductor substrate 122 in the bipolar area 124. In other words, it is possible perform the actions described with respect to FIGS. 3 to 5 after step described with respect to FIG. 6. The protecting stack 134 would then protect the bipolar area 124 during the spacer manufacturing, but not during the gate module.

Figure 7:
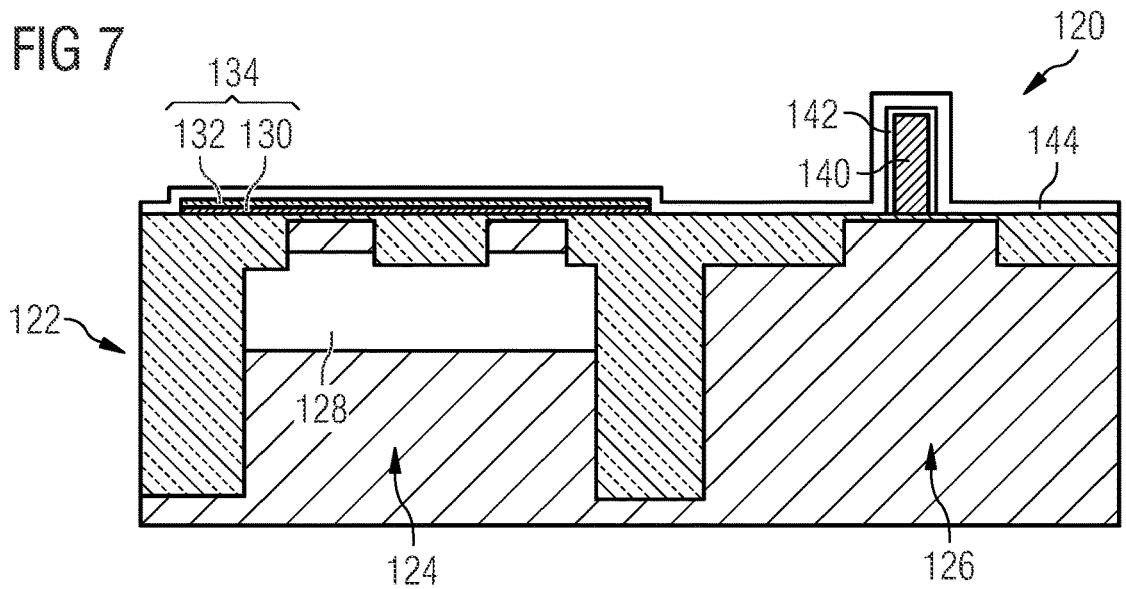
FIG. 7 shows a schematic cross-sectional view of the BiCMOS device during manufacturing during the step of the at least partial manufacturing of the CMOS transistor by providing a spacer layer on the protective layer stack and the CMOS gate with the gate oxide.

FIG. 7 shows a schematic cross-sectional view of the BiCMOS device 120 during manufacturing during the step 106 of the at least partial manufacturing of the CMOS transistor by providing a spacer layer 144 on the protective layer stack 134 and the CMOS gate 140 with the gate oxide 142. The spacer layer 144 can comprise, for example, nitride.

In other words, in FIG. 7, a typical spacer 144 deposition can be done. There is typically more than one spacer related to CMOS. Only one nitride spacer is shown for the illustration. Important is that the spacer etches, cleans, strip steps etc. are not damaging the sensitive bipolar area 124 as it is remains encapsulated by the protecting stack 134. Also, certain anneal steps can be applied to CMOS.

Figure 8:
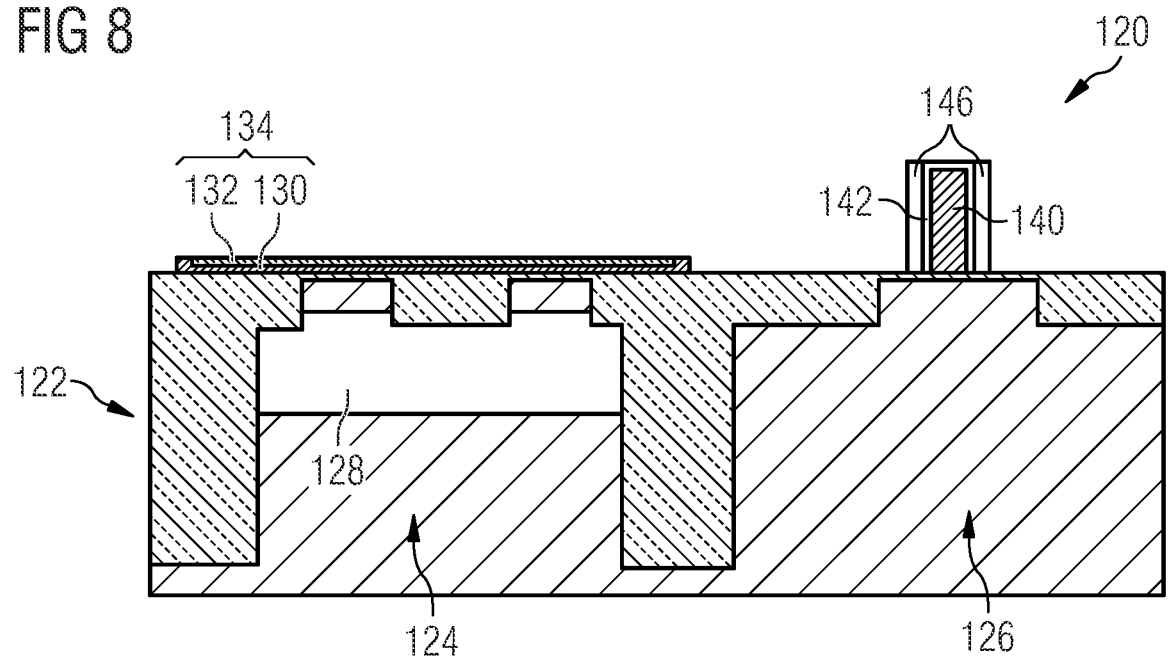
FIG. 8 shows a schematic cross-sectional view of the BiCMOS device during manufacturing during the step of the at least partial manufacturing of the CMOS transistor by structuring the spacer layer to obtain lateral spacers on sidewalls of the CMOS gate or gate oxide.

FIG. 8 shows a schematic cross-sectional view of the BiCMOS device 120 during manufacturing during the step 106 of the at least partial manufacturing of the CMOS transistor by structuring the spacer layer 144 to obtain lateral spacers 146 on sidewalls of the CMOS gate 140 or gate oxide 142.

In other words, in FIG. 8 the spacer etching is done. The bipolar area 124 is unaffected since the etching stops by the protecting stack 134.

Figure 9:
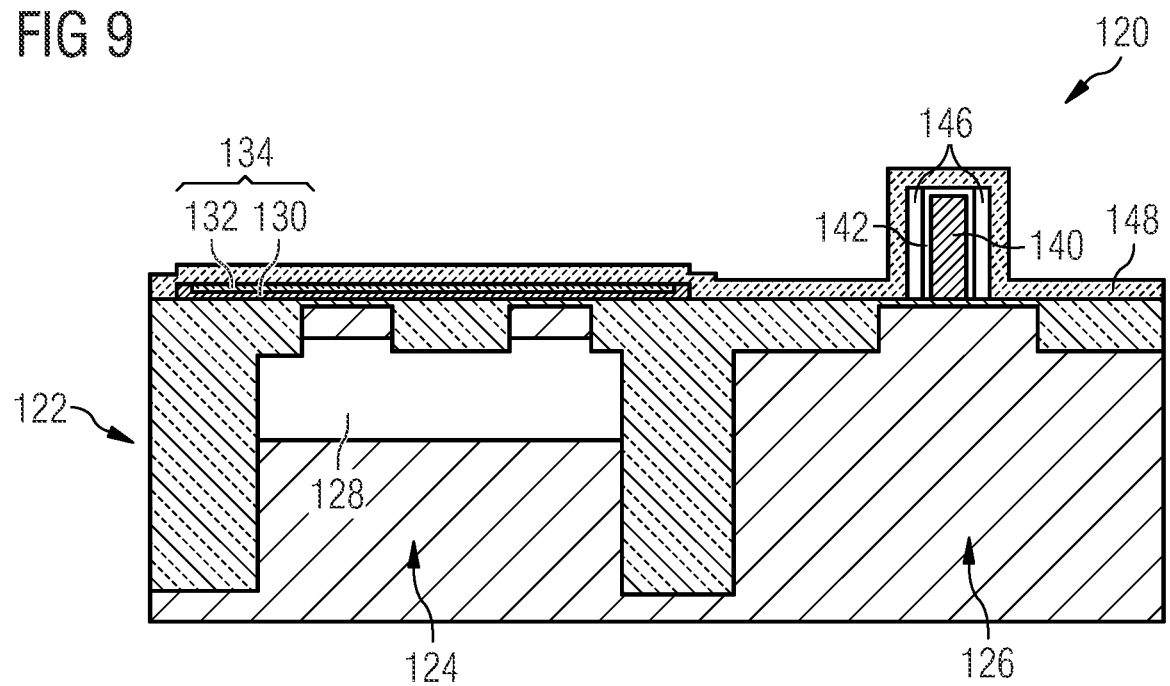
FIG. 9 shows a schematic cross-sectional view of the BiCMOS device during manufacturing after the step of the at least partial manufacturing of the CMOS transistor.

FIG. 9 shows a schematic cross-sectional view of the BiCMOS device 120 during manufacturing after the step 106 of the at least partial manufacturing of the CMOS transistor. As shown in FIG. 9, the semiconductor substrate 122 and also the protective layer stack 134 and the processed CMOS gate 140 with the lateral spacers 146 can be covered by a hard mask 148.

In other words, in FIG. 9, it is exemplarily assumed that all or most of CMOS-related steps have been completed. The wafer 122 is covered by a hard mask layer 148 or layer stack. In this example oxide is used.

After the at least partial manufacturing of the CMOS transistor, the protective layer stack 134 can be removed. The removal of the protective layer stack 134 is described subsequently making reference to FIGS. 10 and 11.

FIG. 10 shows a schematic cross-sectional view of the BiCMOS device 120 during manufacturing after a step of providing a protective mask 150 on the at least partially manufactured CMOS transistor 162 before removing the protective layer stack 134. The protective mask 150 (e.g., hard mask) on the on the at least partially manufactured CMOS transistor can be obtained, for example, by providing a protective mask layer on the protective layer or protective layer stack and the at least partially manufactured CMOS device, and removing the protective mask layer on the protective layer stack 134 while maintaining a portion of the protective mask layer covering the at least partially manufactured CMOS transistor.

The protective mask 150 can be adapted to protect the at least partially manufactured CMOS transistor 162 during the at least a partial manufacturing of the bipolar device. Further, the protective mask 150 can be used as a as a silicide formation blocking mask.

In other words, in FIG. 10 a lithography mask 150 can be applied. The mask 150 can be opened over the bipolar transistor area 124. The hard mask 150 material and part of the protecting stack 134 can be etched.

FIG. 11 shows a schematic cross-sectional view of the BiCMOS device 120 during manufacturing after the step 108 of removing the protective layer stack 134, to expose the semiconductor substrate 122 in the bipolar area 124.

For example, the remaining layers of the protecting stack 134 can be etched off by any suitable combination of etchings, dry or wet. The resist can be stripped. The bipolar transistor area 204 can be now in its initial and undamaged state available for further processing. At the same time, the ready CMOS 162 is covered by the hard mask 150 that serves as a protection during the bipolar processing. It can also be used to define the areas of a silicide formation later in the flow.

FIG. 12 shows a schematic cross-sectional view of the BiCMOS device 120 during manufacturing after the step 110 of at least partially manufacturing the bipolar transistor 160 in the bipolar area 124 of the semiconductor substrate 122.

Note that, just for illustration purposes FIG. 12 shows a processed generic bipolar transistor and a still covered and protected CMOS region.

FIG. 13 shows a schematic cross-sectional view of the BiCMOS device 120 during manufacturing during a step of commonly completing the manufacturing of the bipolar transistor and of the CMOS transistor 162.

For example, the protecting layer over CMOS region 126 can be removed and now both types of transistors can be ready for further common processing e. g. silicide and contacts.

Embodiments provide a manufacturing of a protecting system over the bipolar area prior to CMOS manufacturing.

Embodiments provide a dedicated protection stack over the bipolar transistor area that helps to encapsulate and preserve the bipolar area during the CMOS processing. This can be used, for example, for bipolar-late or bipolar-last BiCMOS integration approaches.

Embodiments provide a hard mask based removal of the encapsulation that at the same time can serve as a CMOS protection and silicide building mask.

Embodiments solve the problem of the integration of a bipolar transistor at an arbitrary point of the CMOS integration in the BiCMOS integration scheme. Embodiments can be used, for example, for bipolar-last approaches.

The above described embodiments are merely illustrative for the principles of the present disclosure. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

The invention claimed is:

1. A method for manufacturing a combined semiconductor device, the method comprising:
   providing a semiconductor substrate;
   providing a protective layer or a protective layer stack in a non-CMOS area of the semiconductor substrate, wherein the non-CMOS area is a portion of the semiconductor substrate reserved for a non-CMOS device, and the protective layer or the protective later stack is completely removed in a CMOS area of the semiconductor substrate, and the non-CMOS area and the CMOS area are different from each other;
   manufacturing at least a portion of a CMOS device in the CMOS area of the semiconductor substrate having the protective layer or the protective layer stack removed, wherein the manufacturing of the at least the portion of the CMOS device comprises manufacturing a gate of the CMOS device, covering the gate with a spacer layer, and structuring the spacer layer to obtain lateral spacers;
   after the manufacturing of the at least the portion of the CMOS device, removing the protective layer or the protective layer stack in the non-CMOS area, to expose the semiconductor substrate in the non-CMOS area; and
   manufacturing a base and emitter of a non-CMOS device over a portion of the semiconductor substrate in the non-CMOS area of the semiconductor substrate.

2. The method according to claim 1, wherein the protective layer or protective layer stack is provided before the manufacturing of the at least the portion of the CMOS device.

3. The method according to claim 1, wherein the lateral spacers are on sidewalls of the gate of the CMOS device.

4. The method according to claim 1, wherein the manufacturing of the at least the portion of the CMOS device comprises at least one etch back step.

5. The method according to claim 1, wherein the step of providing the protective layer or protective layer stack comprises:
   depositing the protective layer or protective layer stack on the semiconductor substrate; and
   structuring the protective layer or protective layer stack to define the non-CMOS area of the semiconductor substrate.

6. The method according to claim 1, further comprising providing the protective layer stack in the non-CMOS area of the semiconductor substrate, wherein the protective layer stack comprises at least two layers of materials having different etch rates.

7. The method according to claim 1, further comprising providing the protective layer stack in the non-CMOS area of the semiconductor substrate, wherein the protective layer stack comprises an oxide layer.

8. The method according to claim 1, further comprising providing the protective layer stack in the non-CMOS area of the semiconductor substrate, wherein the protective layer stack comprises a nitride layer.

9. The method according to claim 1, further comprising:
   providing a protective mask layer on the protective layer or the protective layer stack and the manufactured at least a portion of the CMOS device before removing the protective layer or the protective layer stack in the non-CMOS area.

10. The method according to claim 9, wherein the step of removing the protective layer or the protective layer stack in the non-CMOS area comprises removing the protective mask layer on the protective layer or the protective layer stack while maintaining a portion of the protective mask covering the manufactured at least a portion of the CMOS device.

11. The method according to claim 9, further comprising:
    forming silicide in areas defined by the protective mask layer.

12. The method according to claim 9, wherein the protective mask layer is a hard mask.

13. The method according to claim 9, further comprising:
    removing the protective mask layer while maintaining a portion of the protective mask layer covering the at least partially manufactured CMOS device.

14. The method according to claim 1, wherein the non-CMOS device is selected from a group consisting of a bipolar device, a sensor, MEMS device, a diode, and a varactor.

15. The method according to claim 1, wherein the CMOS device is a CMOS transistor.

* * * * *